United States Patent [19]

Suda

[11] Patent Number: 5,682,156
[45] Date of Patent: Oct. 28, 1997

[54] DECODING CIRCUIT FOR VARIABLE LENGTH CODE IN WHICH POSITIVE/ NEGATIVE DISCRIMINATION IS INDEPENDENT OF DECODING

[75] Inventor: Misako Suda, Kanagawa, Japan

[73] Assignee: NEC Corporation, Tokyo, Japan

[21] Appl. No.: 444,861

[22] Filed: May 19, 1995

[30] Foreign Application Priority Data

May 19, 1994 [JP] Japan ................................. 6-105323

[51] Int. Cl.$^6$ .................................................. H03M 7/42
[52] U.S. Cl. .................................. 341/67; 341/106
[58] Field of Search ............................... 341/67, 106

[56] References Cited

U.S. PATENT DOCUMENTS

| | | | |
|---|---|---|---|
| 4,150,368 | 4/1979 | Chea, Jr. .................. | 341/108 |
| 4,580,129 | 4/1986 | Bhagat .................... | 340/347 |
| 5,398,027 | 3/1995 | Ooi ......................... | 341/67 |

FOREIGN PATENT DOCUMENTS

| | | |
|---|---|---|
| 0 562 419 A2 | 9/1993 | European Pat. Off. . |
| 0 582 273 | 2/1994 | European Pat. Off. . |
| 0 582 273 A2 | 6/1994 | European Pat. Off. . |
| 6-51943 | 2/1994 | Japan . |

*Primary Examiner*—Jeffrey A. Gaffin
*Assistant Examiner*—Thuy-Trang N. Huynh
*Attorney, Agent, or Firm*—Foley & Lardner

[57] ABSTRACT

A variable length code decoding circuit provides a positive/ negative inversion circuit which directly receives the most significant bit of the shift register receiving the code data. For variable length code data accompanying the sign bit, the positive/negative discriminating processing is performed independently of the decoding processing. Thus, although the size of the variable length code decoding table becomes large and the data length of the codes are increased by one bit, the decoding processing is not dropped because of the increase in the number of the decoding processing cycles. In addition, the variable length code decoding circuit can be used for a color moving image compress technology in accordance with the MPEGI of the ISO standard.

6 Claims, 14 Drawing Sheets

FIGURE 3
PRIOR ART

| CODE | MEANING |
|---|---|
| 1 0 . . . . . . | 1 |
| 1 1 . . . . . . | 2 |
| 0 1 0 . . . . . | 3 |
| 0 1 1 . . . . . | 4 |
| 0 0 1 0 . . . . | 5 |
| 0 0 1 1 . . . . | 6 |
| 0 0 0 1 . . . . | 7 |
| 0 0 0 0 1 . . . | 8 |
| 0 0 0 0 0 1 0 . | 9 |
| 0 0 0 0 0 1 1 . | 10 |
| 0 0 0 0 0 0 1 . | 11 |
| 0 0 0 0 0 0 0 1 | 12 |
| 0 0 0 0 0 0 0 0 | 13 |

|  | NEXT TABLE ENTRY ADDRESS | | DECODED CONDITION |
|---|---|---|---|
| ACCESS ADDRESS | MEANING OF CODE | SHIFT AMOUNT |  |
| 0000 0000 0000  0 | 1 | 2 | 1 |
| 0000 0000 0001  1 | 2 | 2 | 1 |
| 0000 0000 0010  2 | 1 | 2 | 0 |
| 0000 0000 0011  3 | 2 | 2 | 0 |
| 0000 0000 0100  4 | 3 | 2 | 1 |
| 0000 0000 0101  5 | 7 | 2 | 0 |
| 0000 0000 0110  6 | 5 | 2 | 0 |
| 0000 0000 0111  7 | 6 | 2 | 0 |
| 0000 0000 1000  8 | 3 | 1 | 0 |
| 0000 0000 1001  9 | 3 | 1 | 0 |
| 0000 0000 1010  A | 4 | 1 | 0 |
| 0000 0000 1011  B | 4 | 1 | 0 |
| 0000 0000 1100  C | 5 | 2 | 1 |
| 0000 0000 1101  D | 4 | 2 | 1 |
| 0000 0000 1110  E | 8 | 1 | 0 |
| 0000 0000 1111  F | 8 | 1 | 0 |
| 0000 0001 0000 10 | 9 | 1 | 0 |
| 0000 0001 0001 11 | 9 | 1 | 0 |
| 0000 0001 0010 12 | 10 | 1 | 0 |
| 0000 0001 0011 13 | 10 | 1 | 0 |
| 0000 0001 0100 14 | 13 | 2 | 0 |
| 0000 0001 0101 15 | 12 | 2 | 0 |
| 0000 0001 0110 16 | 11 | 1 | 0 |
| 0000 0001 0111 17 | 11 | 1 | 0 |

RETRIEVAL CONTINUATION DESIGNATING PART
0 : END   1 : CONTINUATION

SHIFT NUMBER JUST AFTER END OF RETRIEVAL
0 0 0   1 BIT SHIFT
0 0 1   2 BITS SHIFT

UPPER ADDRESS IN CASE OF RETRIEVAL CONTINUATION CODE DATA IN CASE OF RETRIEVAL END

| ACCESS ADDRESS | NEXT TABLE ENTRY ADDRESS | | DECODED CONDITION |
|---|---|---|---|
| | MEANING OF CODE | SHIFT AMOUNT | |
| 0 | 1 | 3 | 1 |
| 1 | 2 | 3 | 1 |
| 2 | 3 | 3 | 0 |
| 3 | 4 | 3 | 0 |
| 4 | 1 | 2 | 0 |
| 5 | 1 | 2 | 0 |
| 6 | 2 | 2 | 0 |
| 7 | 2 | 2 | 0 |
| 8 | 3 | 3 | 1 |
| 9 | 4 | 3 | 1 |
| A | 8 | 2 | 0 |
| B | 8 | 2 | 0 |
| C | 7 | 1 | 0 |
| D | 7 | 1 | 0 |
| E | 7 | 1 | 0 |
| F | 7 | 1 | 0 |
| 10 | 5 | 1 | 0 |
| 11 | 5 | 1 | 0 |
| 12 | 5 | 1 | 0 |
| 13 | 5 | 1 | 0 |
| 14 | 6 | 1 | 0 |
| 15 | 6 | 1 | 0 |
| 16 | 6 | 1 | 0 |
| 17 | 6 | 1 | 0 |

| ACCESS ADDRESS | NEXT TABLE ENTRY ADDRESS | | DECODED CONDITION |
|---|---|---|---|
| | MEANING OF CODE | SHIFT AMOUNT | |
| 18 | 13 | 2 | 0 |
| 19 | 13 | 2 | 0 |
| 1A | 12 | 2 | 0 |
| 1B | 12 | 2 | 0 |
| 1C | 11 | 1 | 0 |
| 1D | 11 | 1 | 0 |
| 1E | 11 | 1 | 0 |
| 1F | 11 | 1 | 0 |
| 20 | 9 | 1 | 0 |
| 21 | 9 | 1 | 0 |
| 22 | 9 | 1 | 0 |
| 23 | 9 | 1 | 0 |
| 24 | 10 | 1 | 0 |
| 25 | 10 | 1 | 0 |
| 26 | 10 | 1 | 0 |
| 27 | 10 | 1 | 0 |

FIGURE 7
PRIOR ART

| ACCESS ADDRESS | NEXT TABLE ENTRY ADDRESS | | DECODED CONDITION |
|---|---|---|---|
| | MEANING OF CODE | SHIFT AMOUNT | |
| 0 | 1 | 4 | 1 |
| 1 | 7 | 4 | 0 |
| 2 | 5 | 4 | 0 |
| 3 | 6 | 4 | 0 |
| 4 | 3 | 3 | 0 |
| 5 | 3 | 3 | 0 |
| 6 | 4 | 3 | 0 |
| 7 | 4 | 3 | 0 |
| 8 | 1 | 2 | 0 |
| 9 | 1 | 2 | 0 |
| A | 1 | 2 | 0 |
| B | 1 | 2 | 0 |
| C | 2 | 2 | 0 |
| D | 2 | 2 | 0 |
| E | 2 | 2 | 0 |
| F | 2 | 2 | 0 |
| 10 | 13 | 4 | 0 |
| 11 | 12 | 4 | 0 |
| 12 | 11 | 3 | 0 |
| 13 | 11 | 3 | 0 |
| 14 | 9 | 3 | 0 |
| 15 | 9 | 3 | 0 |
| 16 | 10 | 3 | 0 |
| 17 | 10 | 3 | 0 |
| 18 | 8 | 1 | 0 |
| ∫ | ∫ | ∫ | ∫ |
| 1F | | | |

FIGURE 9 PRIOR ART

| ENTRY_NUM | DATA/ADDR | NEXT_SFT | TERM/NONTERM |
|---|---|---|---|
| 0 | 1 6 | 4 | 1 |
| 1 | 3 2 | 4 | 1 |
| 2 | 4 8 | 4 | 1 |
| 3 | 6 4 | 4 | 1 |
| 4 | 0 0 0 2 | 4 | 0 |
| 5 | 0 2 0 1 | 4 | 0 |
| 6 | 0 1 0 1 | 3 | 0 |
| 7 | 0 1 0 1 | 3 | 0 |
| 8 | f f f f | 2 | 0 |
| 9 | f f f f | 2 | 0 |
| 10 | f f f f | 2 | 0 |
| 11 | f f f f | 2 | 0 |
| 12 | 0 0 0 1 | 2 | 0 |
| 13 | 0 0 0 1 | 2 | 0 |
| 14 | 0 0 0 1 | 2 | 0 |
| 15 | 0 0 0 1 | 2 | 0 |
| 16 | 8 0 | 4 | 1 |
| 17 | 9 6 | 4 | 1 |
| 18 | 1 1 2 | 4 | 1 |
| 19 | 1 2 8 | 4 | 1 |
| 20 | f f f e | 2 | 0 |
| 21 | f f f e | 2 | 0 |
| 22 | f f f e | 2 | 0 |
| 23 | f f f e | 2 | 0 |
| 24 | 0 2 0 2 | 3 | 0 |
| 25 | 0 2 0 2 | 3 | 0 |
| 26 | 0 9 0 1 | 3 | 0 |
| 27 | 0 9 0 1 | 3 | 0 |
| 28 | 0 0 0 4 | 3 | 0 |
| 29 | 0 0 0 4 | 3 | 0 |
| 30 | 0 8 0 1 | 3 | 0 |
| 31 | 0 8 0 1 | 3 | 0 |
| 32 | 0 7 0 1 | 2 | 0 |
| 33 | 0 7 0 1 | 2 | 0 |
| 34 | 0 7 0 1 | 2 | 0 |
| 35 | 0 7 0 1 | 2 | 0 |
| ≀ | ≀ | ≀ | ≀ |
| 247 | 0 1 0 a | 1 | 0 |
| 248 | 0 1 0 9 | 1 | 0 |
| 249 | 0 1 0 9 | 1 | 0 |
| 250 | 0 1 0 8 | 1 | 0 |
| 251 | 0 1 0 8 | 1 | 0 |

FIGURE 10
PRIOR ART

| ENTRY_NUM | DATA_FIELD | CODE |
|---|---|---|
| 1 | FFFF | 10 |
| 2 | 0001 | 11 |
| 3 | 0101 | 011 |
| 4 | 0002 | 0100 |
| 5 | 0201 | 0101 |
| 6 | 0003 | 00101 |
| 7 | 0301 | 00111 |
| 8 | 0401 | 00110 |
| 9 | 0102 | 000110 |
| 10 | 0501 | 000111 |
| 11 | 0601 | 000101 |
| 12 | 0701 | 000100 |
| 13 | 0004 | 0000110 |
| 14 | 0202 | 0000100 |
| 15 | 0801 | 0000111 |
| 16 | 0901 | 0000101 |
| 17 | FFFE | 000001 |
| 18 | 0005 | 00100110 |
| 19 | 0006 | 00100001 |
| 20 | 0103 | 00100101 |
| 21 | 0302 | 00100100 |
| 22 | 0A01 | 00100111 |
| 23 | 0B01 | 00100011 |
| 24 | 0C01 | 00100010 |
| 25 | 0D01 | 00100000 |
| 26 | 0007 | 000000101 0 |
| 27 | 0104 | 000000110 0 |
| 28 | 0203 | 000000101 1 |
| 29 | 0402 | 000000111 1 |
| 30 | 0502 | 000000100 1 |
| 31 | 0E01 | 000000111 0 |
| 32 | 0F01 | 000000110 1 |
| 33 | 1001 | 000000100 0 |
| 34 | 0008 | 00000001110 1 |
| 35 | 0009 | 00000001100 0 |
| ⋮ | ⋮ | ⋮ |
| 100 | 0111 | 0000000000010001 |
| 101 | 0112 | 0000000000010000 |
| 102 | 0603 | 0000000000010100 |
| 103 | 0B02 | 0000000000011010 |
| 104 | 0C02 | 0000000000011001 |

| CODE | MEANING |
|---|---|
| 1 0 s . . . . . . | 1 |
| 1 1 s . . . . . . | 2 |
| 0 1 0 s . . . . . | 3 |
| 0 1 1 s . . . . . | 4 |
| 0 0 1 0 s . . . . | 5 |
| 0 0 1 1 s . . . . | 6 |
| 0 0 0 1 s . . . . | 7 |
| 0 0 0 0 1 s . . . | 8 |
| 0 0 0 0 0 1 0 s | 9 |
| 0 0 0 0 0 1 1 s | 10 |
| 0 0 0 0 0 0 1 s | 11 |
| 0 0 0 0 0 0 0 1 s | 12 |
| 0 0 0 0 0 0 0 s | 13 |

LAST BIT "S" INDICATES "+" BY "0" AND "−" BY "1"

| CODE | MEANING |
|---|---|
| 0 0 0 0 0 0 0 1 | −13 |
| 0 0 0 0 0 0 1 1 | −12 |
| 0 0 0 0 0 1 1 . | −11 |
| 0 0 0 0 0 1 1 1 . | −10 |
| 0 0 0 0 0 1 0 1 . | −9 |
| 0 0 0 0 1 1 . . . | −8 |
| 0 0 0 1 1 . . . . | −7 |
| 0 0 1 1 1 . . . . | −6 |
| 0 0 1 0 1 . . . . | −5 |
| 0 1 1 1 . . . . . | −4 |
| 0 1 0 1 . . . . . | −3 |
| 1 1 1 . . . . . . | −2 |
| 1 0 1 . . . . . . | −1 |
| 1 0 0 . . . . . . | +1 |
| 1 1 0 . . . . . . | +2 |
| 0 1 0 0 . . . . . | +3 |
| 0 1 1 0 . . . . . | +4 |
| 0 0 1 0 0 . . . . | +5 |
| 0 0 1 1 0 . . . . | +6 |
| 0 0 0 1 0 . . . . | +7 |
| 0 0 0 0 1 0 . . . | +8 |
| 0 0 0 0 0 1 0 0 . | +9 |
| 0 0 0 0 0 1 1 0 . | +10 |
| 0 0 0 0 0 0 1 0 . | +11 |
| 0 0 0 0 0 0 0 1 0 | +12 |
| 0 0 0 0 0 0 0 0 | +13 |

DECODING CIRCUIT FOR VARIABLE LENGTH CODE IN WHICH POSITIVE/ NEGATIVE DISCRIMINATION IS INDEPENDENT OF DECODING

BACKGROUND OF THE INVENTION

1. Field of the Invention

The present invention relates generally to a decoding circuit for a variable bit length code.

2. Description of Related Art

It has been known that, in the case of coding signals appearing in a time sequence with deviated frequencies of occurrences, a compression coding can be realized by employing a variable-length code by providing shorter codes for signals having high frequencies of occurrences and longer codes for signals having low frequencies of occurrences. One typical example of a variable length code decoding circuit in the prior art in accordance with this type of technology is disclosed in Japanese Patent Application Laid open Publication No. JP-A-06-051943, which corresponds to EP-A-0 582 273 and U.S. Pat. No. 5,398,027, the disclosures of which are incorporated by reference in their entirety into the present application.

Referring to FIG. 1, there is shown a block diagram of the variable length code decoding circuit disclosed in YP-A-06-051943. This variable length code decoding circuit includes a 20-bit variable length code decoding table 301, a 14-bit decoding start address register 304 receiving a 14-bit decoding start address, a "2 to 1" 20-bit multiplexor (2-input/1-output selector, or "1-out-of 2" selector) 309 receiving an output signal C1 of the variable length code decoding table 301 and an output signal C2 of the decoding start address register 304, a 16-bit decoding resultant data register 303 receiving the most significant 16-bits (output signal C3) of the output. of the "2 to 1" multiplexor 309 and controlled by the least significant one bit (output signal C5) of the output of the "2 to 1" multiplexor 309, a sequencer 302 controlled by the output signal C5, a shift control circuit 305 and a shifting magnitude decoder 307 both of which receive the most significant three bits (output signal C6) of the least significant four bits of the output of the "2 to 1" multiplexor 309, a shift register 306 controlled by an output signal C7 of the shift control circuit 305 to shift a code data, a "3 to 1" 12-bit multiplexor (3-input/1-output selector, or "1-out-of 3" selector) 308 receiving the shifted data output signal of the shift register 306 and the least significant ten bits (output signal C4) of the output signal C3, a 12-bit variable length code decoding table address register 310 receiving an output of the "3 to 1" multiplexor 308, for generating an output signal C8 to be supplied to the variable length code decoding table 301. A control circuit 311 is constituted of the sequencer 302 and the shift control circuit 305. The sequencer 302 generates various timing signals to be supplied to various parts in the circuit for determining the start, the execution and the end of the decoding operation.

FIG. 2 illustrates a structure of the variable length code decoding table 301. The variable length decoding table 301 includes a retrieval continuation designating portion of one bit, three bits of data representative of the shifting number immediately after completion of decoding, and three bits of an upper (block) address when the retrieval is to be continued. In addition, FIG. 3 shows one example of one group of variable length codes. FIGS. 4A, 4B and 4C are state transition diagrams at the time of decoding the variable length code shown in FIG. 3, in units of two bits, three bits or four bits.

FIGS. 5, 6 and 7 illustrate variable length code decoding tables corresponding to the state transition diagrams shown in FIGS. 4A, 4B and 4C. FIG. 8 is a timing chart when the variable length code decoding table shown in FIG. 5 is used to decode the code shown in FIG. 3 in accordance with the state transition diagram shown in FIG. 4A. FIG. 9 is an example of the decoding table for decoding the variable length code for the 16-bit code in the prior an example now under examination, this table corresponding to the example of the timing chart shown in FIG. 8.

Now, the conventional variable length code decoding method will be described with reference to FIGS. 3, 4A, 4B, 4C and 5. As shown in FIG. 4A, the decoding is advanced by tracing the code shown in FIG. 3 from the left side in units of two bits. In this case, circles shown in FIG. 4A indicate an initial state and an intermediate state in the decoding procedure. The decoding procedure is started from the leftmost circle, and if the first two bits in the decoding procedure are "00", the branch labelled "00" is traced, and if the first two bits are "01", the branch labelled "01" is traced. In this manner, the meaning corresponding to the codes shown in FIG. 3 is decoded. In this case, the branch "0X" means both the branch "00" and the branch "01". Here, "X" means "don't care", namely, is a sign of a redundancy.

Incidentally, FIG. 4B illustrates the decoding procedure of advancing the decoding by tracing the code shown in FIG. 3 from the left side in units of three bits. FIG. 4C illustrates the decoding procedure of advancing the decoding by tracing the code shown in FIG. 3 from the left side in units or four bits.

The decoding table shown in FIG. 5 is the table obtained by realizing the state transition shown in FIG. 4A. In FIG. 5, the right column indicates whether the decoding state is in an intermediate state or in a complete state ("0"= complete; "1"=incomplete). Namely, the intermediate state is indicate by "1", and the complete state is indicated by "0". The left column shows an access address for a next table when the decoding is in the intermediate state, and indicates which of the branches in the state transition diagram shown in FIG. 4A should be traced. In addition, when the decoding is in the complete condition, the left column shows the meaning of the decoded code (a positive integer in this example).

In the conventional decoding system now under examination, the code is decoded by shifting the code by each two bits, but the code length is not necessarily a multiple of "2". In the example shown in FIG. 3, "8" is indicated by the 5-bit code of "00001". Therefore, it is necessary to adjust the fraction, which is expressed by the redundant item "X" in FIG. 4A. On the other hand, since this redundant item "X" means an overlap with a beginning or heading portion of a next code, it is necessary to reduce the shifting amount in order to ensure that the data is in no way shifted out.

The central column in FIG. 5 is a field designating that when the decoding is completed, the shifting amount of the code is to be changed at the time of the decoding. In this column, "2" means the shifting of two bits, and "1" means the shifting of one bit.

Now, a method for preparing the variable length code decoding table shown in FIG. 5 will be described. The code table shown in FIG. 3 is retrieved in units of two bits in accordance with the state transition diagram shown in FIG. 4A. First of all the meaning of the code determined by retrieving the two bits in FIG. 3 is only "1" and "2", and by further retrieving the two bits, the meaning of the codes corresponding to "3", "4", "5", "6" and "7" can be determined. In this procedure, since the code itself is an address for accessing the variable length code decoding table, "10" means a second address (address Since the meaning of this code is determined, it is necessary to store "1" (as data) at the second address in the variable length code decoding table. On the other hand, since the effective data is two bits, the decoding is completed by putting "0" in the retrieval continuation designating portion in order to cause the decoding to be completed after the shifting of two bits.

Similarly, since "11" is an established code, "2" is put as data at a third address (address 3), and "0" is put in the retrieval continuation designating portion in order to cause the decoding to be completed after the shifting of two bits.

When the meaning of the code is not yet determined, for example, at the time of "01", an address for accessing the next table is put as data, and the amount of the shifting is set to two bits. In this connection, it is possible to designate any address as the address for accessing the next table, but since if the address too jumps the size of the table becomes large, it is preferable to determine an appropriate address.

Thus, in the case of decoding the code table shown in FIG. 2, the decoding table prepared to correspond to the decoding procedure of decoding the code in units of three bits as shown in FIG. 4B is the decoding table shown in FIG. 6, and the decoding table prepared to correspond to the decoding procedure of decoding the code in units of three bits as shown in FIG. 4C is the decoding table shown in FIG. 7. The decoding table shown in FIG. 9 and the code table shown in FIG. 10 are decoding and code tables actually prepared in this manner, respectively. Accordingly, FIG. 9 is a table corresponding to the variable length codes shown in the table of FIG. 10.

As shown in FIG. 10, in the actual codes, signals having high frequencies of occurrences are given shorter codes, and signals having low frequencies of occurrences are given longer codes. The decoding table shown in FIG. 9 includes four fields, and is used to perform the decoding by use of the conventional example shown in FIG. 1. In this decoding table, the field 1 indicates a row (or line) number (including "0"), and the field 2 indicates the row number of the code table to be retrieved next (in the case that the field 4="1"). In addition, the field 2 shows the coded data (in the case that the field 4 ="0"). The field 3 represents the mount of the shifting of the input data train to be shifted before the next retrieval. The field 4 is a flag showing whether or not the decoding is completed at their row (or line). "0" indicates the completion, and "1" indicates the incompletion.

In order to realizing the above mentioned decoding procedure and the decoding table, the variable length code decoding circuit shown in FIG. 1 has been proposed by JP-A-06-051943 referred to hereinbefore.

In the variable length code decoding circuit shown in FIG. 1, the variable length code decoding table 301 has a size of 4K words (=4096 words=$2^{12}$words), and therefore, requires an address signal of 12 bits. Therefore, the bit number of a minimum shifted out of the shifter register 306 is set to be 2 bits, and it is so configured that the total of the bits shifted out of the shifter register 306 and the output signal C4 of the "2 to 1" multiplexor 309 becomes 12 bits. Accordingly, the bit size of the address signal can be modified dependently upon the size of the decoding table.

Similarly, in the decoding start address signal C2 supplied from the decoding start address register 304 receiving the decoding start address, the most significant 10 bits of the 14 bits are an address, and therefore, it is possible to modify the decoding staff address signal C2. The decoding start address is set in the decoding staff address register 304, and then, supplied through the "2 to 1" multiplexor 309. An intermediate data field of the decoding start address is supplied to the shift amount decoder 307 as the selection signal for the "3 to 1" multiplexor 308. On the basis of the output of the shift amount decoder 307, the address signal of 12 bits for the variable length code decoding table 301 is generated. Incidentally, the variable length code decoding table 301 having the structure shown in FIG. 2 is loaded with any one of the decoding tables shown in FIGS. 5, 6, 7 and 9, in order to cause the variable length code decoding circuit shown in FIG. 1 to properly operate.

Now, operation will be described with reference to the timing chaff of FIG. 8 and the decoding table of FIG. 5. In FIG. 8 and in this specification, the suffix "h" represents a hexadecimal notation.

First, at a time T1, the decoding start address and the code data are loaded to the decoding start address register 304 and the shift register 306, respectively. At this time, the most significant ten bits are the start address, and the shift amount to be retrieved and the retrieval continuation data is put in the least significant four bits. Here, it is assumed that the code data in the shift register 306 is "00001X". In this case, "X" is a sign indicating the redundancy and the header of the next code, and therefore, "X" cannot be shifted out.

Furthermore, at the timing t1 in FIG. 8 the decoding start address C2 is outputted without modification from the "2 to 1" multiplexor 309 as the output signals C4, C5 and C6. With the output signal C5, the start of the code retrieval is notified to the sequencer 302, and therefore, in response to this signal, the sequencer 302 generating various timing signals supplied to various parts, for controlling the start and the execution of the decoding operation.

At the-timing t2, the data "00" is shifted out of the shift register 306 in accordance with the shift amount designated by the output signal C6 (the shifting out of two bits in this example), and this data "00" is supplied as the least significant two bits to the "3 to 1" multiplexor 308. On the other hand, the 10-bit data of the signal C4 "00 0000 0000" is supplied to the "3 to 1" multiplexor 308 as the most significant 10 bits. Therefore, the "3 to 1" multiplexor 308 outputs the 12-bit data "0000 0000 0000", which is in turn supplied to and stored in the variable length code decoding table address register 310. Accordingly, for the next address, the address of "000h" is supplied from the variable length code decoding table address register 310 as the signal C8 to the variable length code decoding table 301 for data retrieval (See FIG. 5).

At the timing 13 in FIG. 8, "00013h" is outputted from the variable length code decoding table 301 as the decoding table output signal C1. In response to this, the "2 to 1" multiplexor 309 outputs the signals C4, C5 and C6 at the timing t4.

At the timing t5 in FIG. 8, the data "00" is shifted out of the shift register 306 in accordance with the shift mount designated by the output signal C6 (the shifting out of two bits in this example), and this data "00" is supplied as the least significant two bits to the "3 to 1" multiplexor 308. On the other hand, the 10-bit data of the signal C4 "00 0000 0001" is supplied to the "3 to 1" multiplexor 308 as the most significant 10 bits. Therefore, the "3 to 1" multiplexor 308 outputs the 12-bit data "0000 0000 0100", which is in turn supplied to and stored in the variable length code decoding table address register 310. Accordingly, for the next address, the address of "004h" is supplied from the variable length code decoding table address register 310 as the signal C8 to the variable length code decoding table 301 for data retrieval (See FIG. 5).

At the timing t6 in FIG. 8. "00033h" is outputted from the variable length code decoding table 301 as the decoding table output signal C1. At the timing t7, the "2 to 1" multiplexor 309 outputs the signals C4, C5 and C6.

At the timing t8 in FIG. 8, the data "1X" is shifted out of the shift register 306 in accordance with the shift mount designated by the output signal C6 (the shifting out of two bits in this example), aria this data "1X" is supplied as the least significant two bits to the "3 to 1" multiplexor 308. On the other hand, the 10-bit data of the signal C4 "00 0000 0011" is supplied to the "3 to 1" multiplexor 308 as the most significant 10 bits. Therefore, the "3 to 1" multiplexor 308 outputs the 12-bit data "0000 0000 111X", which is in turn supplied to and stored in the variable length code decoding table address register 310. Accordingly, for the next address, the address of "00Eh" or "00Fh" having the redundancy is supplied from the variable length code decoding table address register 310 as the signal C8 to the variable length code decoding table 301 for data retrieval (See FIG. 5).

At the timing t9 in FIG. 8, "00080h" is outputted from the variable length code decoding table 301 as the decoding table output signal C1. At the timing t10, the "2 to 1" multiplexor 309 outputs the signals C4, C5 and C6.

At this time, since the output signal C5 is brought to "0", it is informed to the sequencer 302 that the decoding operation is completed. In addition, the data "0008h" is supplied as the signal C3 and stored in the decoding resultant data register 303. Accordingly, this data "0008h" is outputted as the decoding resultant data from the decoding resultant data register 303. Thus, the decoding operation is completed.

The above mentioned operation is repeated, so that the code data supplied to the shift register 306 is sequentially decoded.

In the above mentioned decoding operation, since the code data of 6 bits "00 001X" is retrieved in units of two bits, the retrieval processing can be performed with three cycles. Accordingly, if the decoding table shown in FIG. 6 is used in the processing in units of three bits shown in FIG. 4B, it is possible to complete the retrieval processing with two cycles. Similarly, if the decoding table shown in FIG. 7 is used in the processing in units of four bits shown in FIG. 4C, it is possible to complete the retrieval processing with two cycles.

Therefore, if the code of 8 bits is deemed, the retrieval in units of two bits requires four cycles at maximum as "2→2→2→2", and the retrieval in units of three bits requires three cycles at maximum as "3→3→2". In addition, the retrieval in units of four bits requires two cycles at maximum as "4→4". These are the same as the number of the circles along the flow of processing in FIGS. 4A, 4B and 4C.

In the conventional variable length code decoding circuit as mentioned above, it is possible to reduce the number of retrieval cycles by increasing the number of bits included in each one unit to be retrieved As shown in FIGS. 5, 6 and 7, the decoding table basically becomes large by increasing the number of bits included in each one unit to be retrieved. Namely, the retrieval in units of two bits requires "17h" addresses (24 words) for the decoding table, and the retrieval in units of three bits requires "27h" addresses (40 words) for the decoding table. In addition, the retrieval in units of four bits requires "1Fh" addresses (32 words) for the decoding table. This is attributable to the fact that if the variable length codes have pattern extremely similar to each other, the variable length code decoding table becomes redundant.

However, in a one-chip mask designing, if a memory capacity corresponding w the number of words required for the variable length code decoding table can be physically ensured, the processing speed drops and therefore the performance cannot be satisfied. In addition, the code is actually added at the last bit with a sign bit (indicative of whether me data is positive or negative (plus or minus)). Since the conventional circuit is configured to process the code indicative of a positive integer, the actual meaning of the code is a double, and therefore, the required memory capacity correspondingly increases. Furthermore, both a code table and a decoding table are required, and therefore, the required memory capacity further increases.

Moreover, by the sign bit, the bit length to be processed is increased from 8 bits to 9 bits, and therefore, the processing cycles is basically increased.

Furthermore, in the conventional decoding table, the code bit length and the meaning of the code are greatly different, the conventional decoding table cannot be used as it is.

SUMMARY OF THE INVENTION

Accordingly, it is an object of the present invention to provide a variable length code decoding circuit which has overcome the above mentioned defect of the conventional one.

Another object of the present invention are to provide a variable length code decoding circuit having a reduced size of a variable length code decoding table and capable of easily decoding the variable length code.

The above and other objects of the present invention are achieved in accordance with the present invention by a variable length code decoding circuit comprising:

a variable length code decoding table;

a first memory means receiving and storing a decoding start address;

a first selecting means receiving an output signal of the variable length code decoding table 101 and an output signal of the first memory means so as to output one selected output signal;

a shift register receiving and storing a sequence of variable length codes to be decoded;

a control means receiving the least significant "n" bits of the one selected output signal (where "n" is any positive integer), for controlling a bit shift amount of the shift register;

a second selecting means receiving a portion of the code data stored in the shift register and the least significant "k" bits of the most significant "m" bits of the one selected output signal (where "k" and "m" are any positive integer and "k" is not greater than "m"), for outputting a synthesized address signal;

a second memory means receiving and storing the synthesized address signal, for supplying the stored synthesized address signal to the variable length code decoding table;

a third memory means receiving and storing the most significant "m" bits; and positive/negative inversion circuit receiving a content of the third memory means and controlled by a control signal generated on the basis of the content of the shift register so as to output either the received content of the third memory means without modification or an inverted data of the received content of the third memory means.

In one embodiment of the variable length code decoding circuit, the positive/negative inversion circuit directly receives one of the most significant bit and the least significant bit of the code data stored in the shift register, for discriminating a positive/negative of a decoding resultant data signal, and for outputting, as the decoding resultant data signal, either the received content of the third memory means without modification or an inverted data of the received content of the third memory means.

In another embodiment of the variable length code decoding circuit, the positive/negative inversion circuit directly receives through the shift register a positive/negative discriminating bit generated by shifting the processing end signal, for discriminating a positive/negative of a decoding resultant data signal, and for outputting, as the decoding resultant data signal, either the received content of the third memory means without modification or an inverted data of the received content of the third memory means.

Specifically, the control means includes a sequencer receiving the least significant bit of the least significant "n" bits of the one selected output signal, for controlling an operating timing of the decoding operation, and a shift control circuit receiving some most significant bits of the least significant "n" bits of the one selected output signal, for controlling a bit shift operation of the shift register.

The above and other objects, features and advantages of the present invention will be apparent from the following description of preferred embodiments of the invention with reference to the accompanying drawings.

BRIEF DESCRIPTION OF THE DRAWINGS

FIG. 3 is a table showing one example of the variable length code decoding table;

FIG. 5 is a variable length code decoding table used in performing the decoding in unit of two bits;

FIG. 6 is a variable length code decoding table used in performing the decoding in unit of three bits;

FIG. 7 is a variable length code decoding table used in performing the decoding in unit of four bits;

FIG. 9 is an actual variable length code decoding table used in the prior art;

FIG. 10 is an actual variable length code table used in the prior art;

DESCRIPTION OF THE PREFERRED EMBODIMENTS

Figure 11:
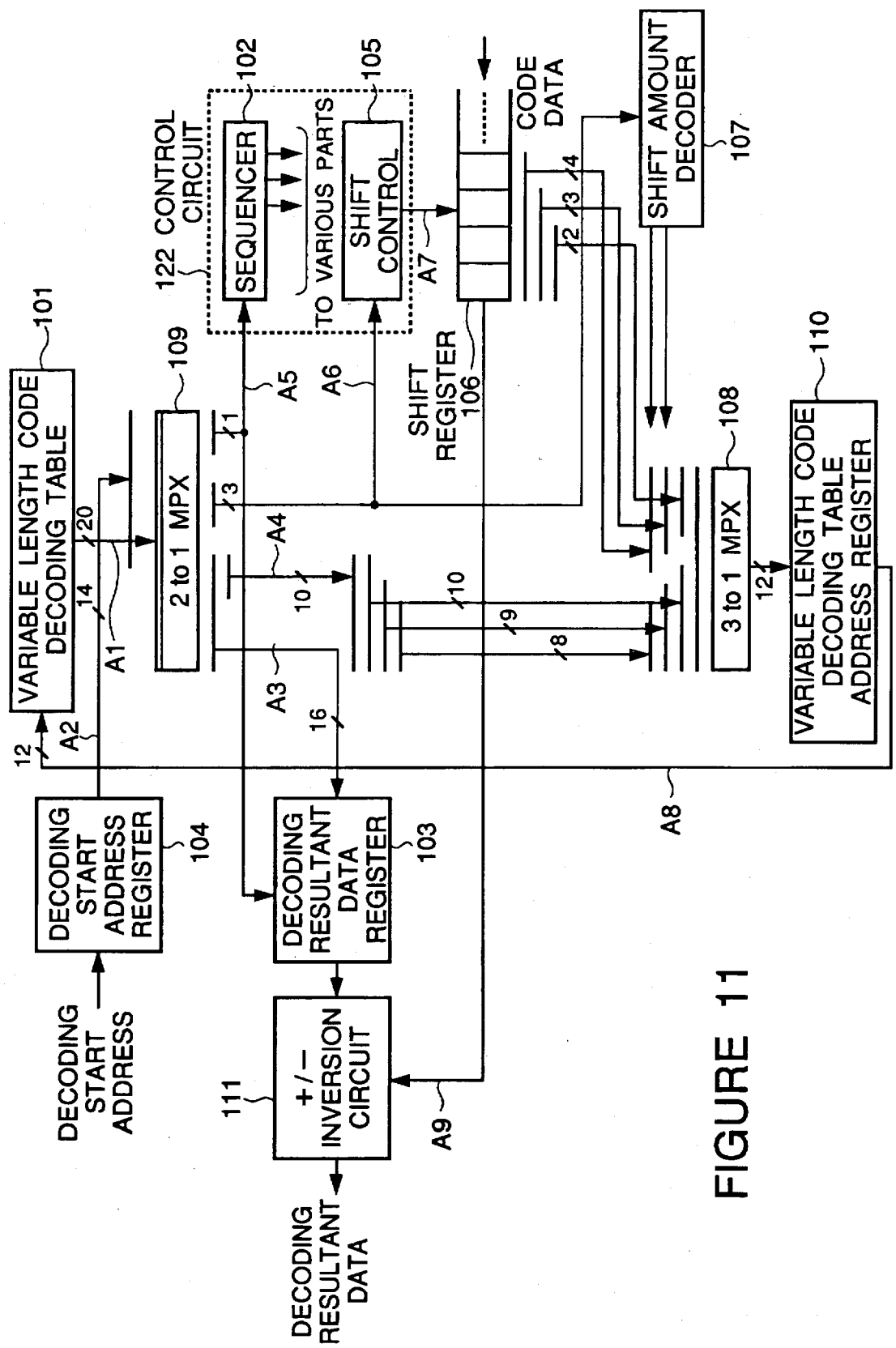
FIG. 11 is a block diagram of a first embodiment of the variable length code decoding circuit in accordance with the present invention.

Referring to FIG. 11, there is shown a diagram of a first embodiment of the variable length code decoding circuit in accordance with the present invention.

The shown variable length code decoding circuit includes a 20-bit variable length code decoding table 101, a 14-bit decoding start address register 104 receiving a 14-bit decoding start address, a "2 to 1" 20-bit multiplexor 109 receiving an output signal A1 of the variable length code decoding table 101 and an output signal A2 of the decoding start address register 104, a 16-bit decoding resultant data register 103 receiving the most significant 16 bits (output signal A3) of the 20-bit output of the "2 to 1" multiplexor 109 and controlled by the least significant one bit (output signal A5) of the 20-bit output of the "2 to 1" multiplexor 109, a sequencer 102 controlled by the output signal A5, a shift control circuit 105 and a shifting magnitude decoder 107 both of which receive the most significant three bits (output signal A6) of the least significant four bits of the 20-bit output of the "2 to 1" multiplexor 109, a shift register. 106 receiving and storing a bit sequence of continuous variable length codes and shift-controlled by an output signal A7 of the shift control circuit 105 to shift the received code data, a "3 to 1" 12-bit multiplexor 108 receiving the shifted data output signal of the shift register 106 and the least significant ten bits (output signal A4) of the output signal A3, a 12-bit variable length code decoding able address register 110 receiving an output of the "3 to 1" multiplexor 108, for generating an output signal A8 to be supplied to the variable length code decoding able 101, and a positive/negative inversion circuit 111 receiving an output of the decoding resultant data register 103 and controlled by an signal A9 from the shift register 106 so as to output either the received data without modification or an inverted data of the received data. A control circuit 122 is constituted of the sequencer 102 and the shift control circuit 105.

In the variable length code decoding circuit shown in FIG. 11, the sequencer 102 receives the output signal A5 from the "2 to 1" multiplexor 109, and generates various timing signals to be supplied to various parts in the circuit for determining the start, the execution and the end of the decoding operation.

In the variable length code decoding circuit Shown in FIG. 11, the variable length code decoding table 101 has a size of 4K words (=4096 words=$2^{12}$ words), and therefore, requires an address signal of 12 bits. Therefore, the bit number of minimum bits shifted out of the shifter register 106 is set to be 2 bits, and the circuit is so configured that the total of the minimum bits shifted out of the shifter register 106 and the output signal A4 of the "2 to 1" multiplexor 109 becomes 12 bits. Accordingly, the bit size of the address signal can be modified dependently upon the size of the decoding table.

Similarly, in the decoding start address signal A2 supplied from the decoding staff address register 104 receiving the decoding start address, the most significant 10 bits of the 14 bits are an address, and therefore, it is possible to modify the decoding start address signal A2.

If the value of the most significant one bit A9 of the output signal outputted from the shift register 106 at the time of the completion of the decoding operation, is "1", the positive/negative inversion circuit 111 outputs, as the decoding resultant data, a 2' complement of the data supplied from the decoding resultant data register 103. If the most significant one bit A9 is "0", the positive/negative inversion circuit 111 outputs, as the decoding resultant data, the data supplied from the decoding resultant data register 103, without modification. However, in the case that the decoding resultant data is constituted of an absolute-value data plus a sign data, (for example, in the case that the positive/negative is discriminated by "1" or "0" of the last bit shown in FIG. 14), the decoding resultant data to be outputted from the positive/negative inversion circuit 111 is generated by simply adding the value of the most significant one bit A9 of the output signal outputted from the shift register 106 at the time of the completion of the decoding operation, to the most or least significant bit position of the data supplied from the decoding resultant data register 103.

Figure 12:
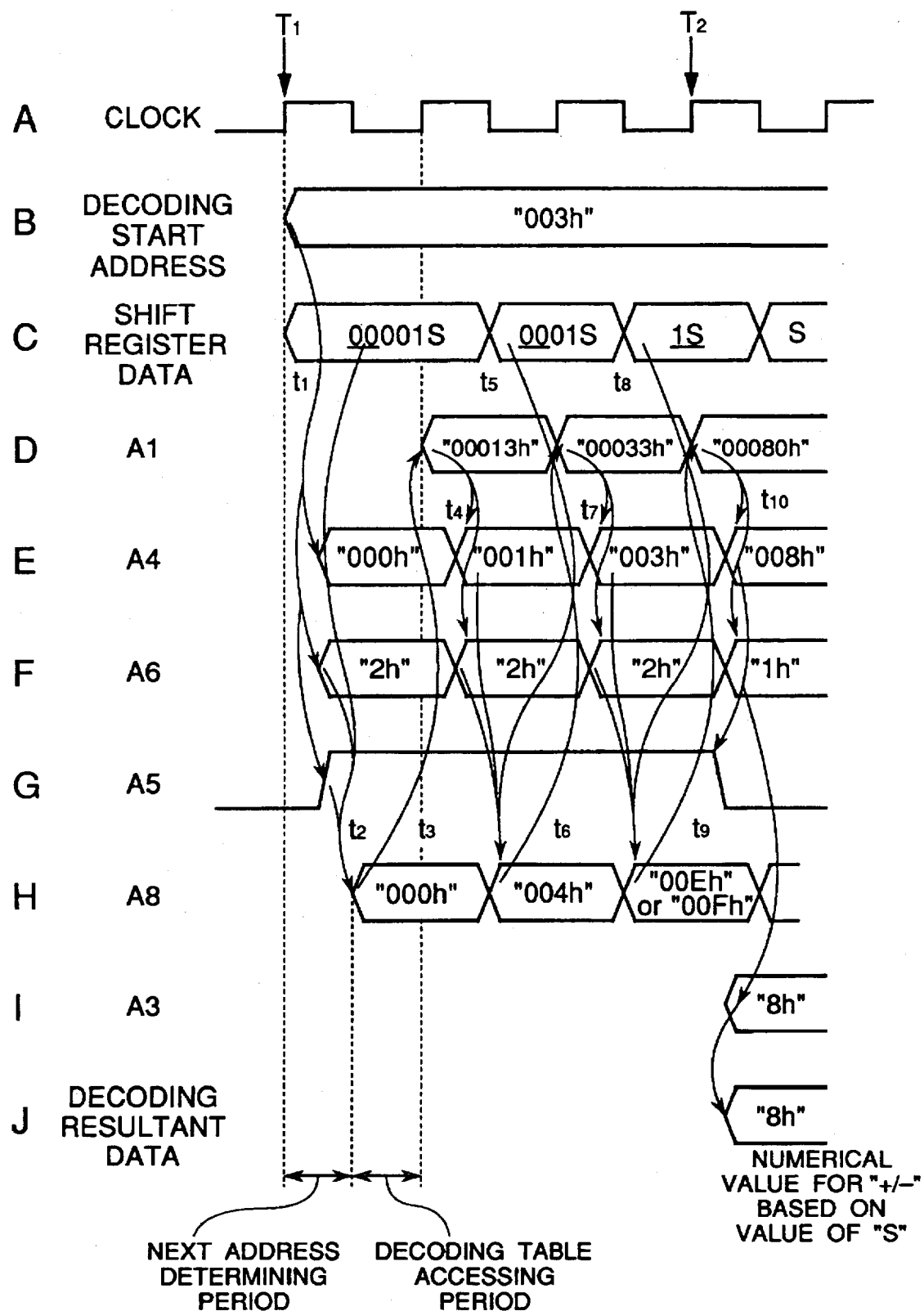
FIG. 12 is a timing chart illustrating the operation of the variable length code decoding circuit shown in FIG. 11.
Figure 14:
FIG. 14 is a variable length code decoding table used in the variable length code decoding circuit in accordance with the present invention.

As mentioned above, FIG. 14 is a table of variable length codes added with a sign bit. FIG. 12 is a timing chart illustrating the operation of the embodiment-shown in FIG. 11 on the basis of the variable length code table shown in FIG. 14. In this case, it is possible to omit the last bit (sign bit) in the variable length code table shown in FIG. 14, and if it is done so the table becomes the same as the variable length code table shown in FIG. 3. In other words, in the variable length code decoding circuit shown in FIG. 11, the last bit (sign bit) in the codes shown in FIG. 14 is supplied to the positive/negative inversion circuit 111 as the most significant bit A9 outputted from the shift register 106 at the time of the completion of the decoding operation, and is processed only in the positive/negative inversion circuit 111. Accordingly, it is possible to omit the sign bit from the code table subjected to an actual decoding processing. Therefore, the decoding table for the variable length code table shown in FIG. 14 becomes the same as those shown in FIGS. 5, 6 and 7.

Now, operation of the first embodiment will be described with reference to FIG. 12 which is a timing chart illustrating the operation of the first embodiment.

Figure 1:
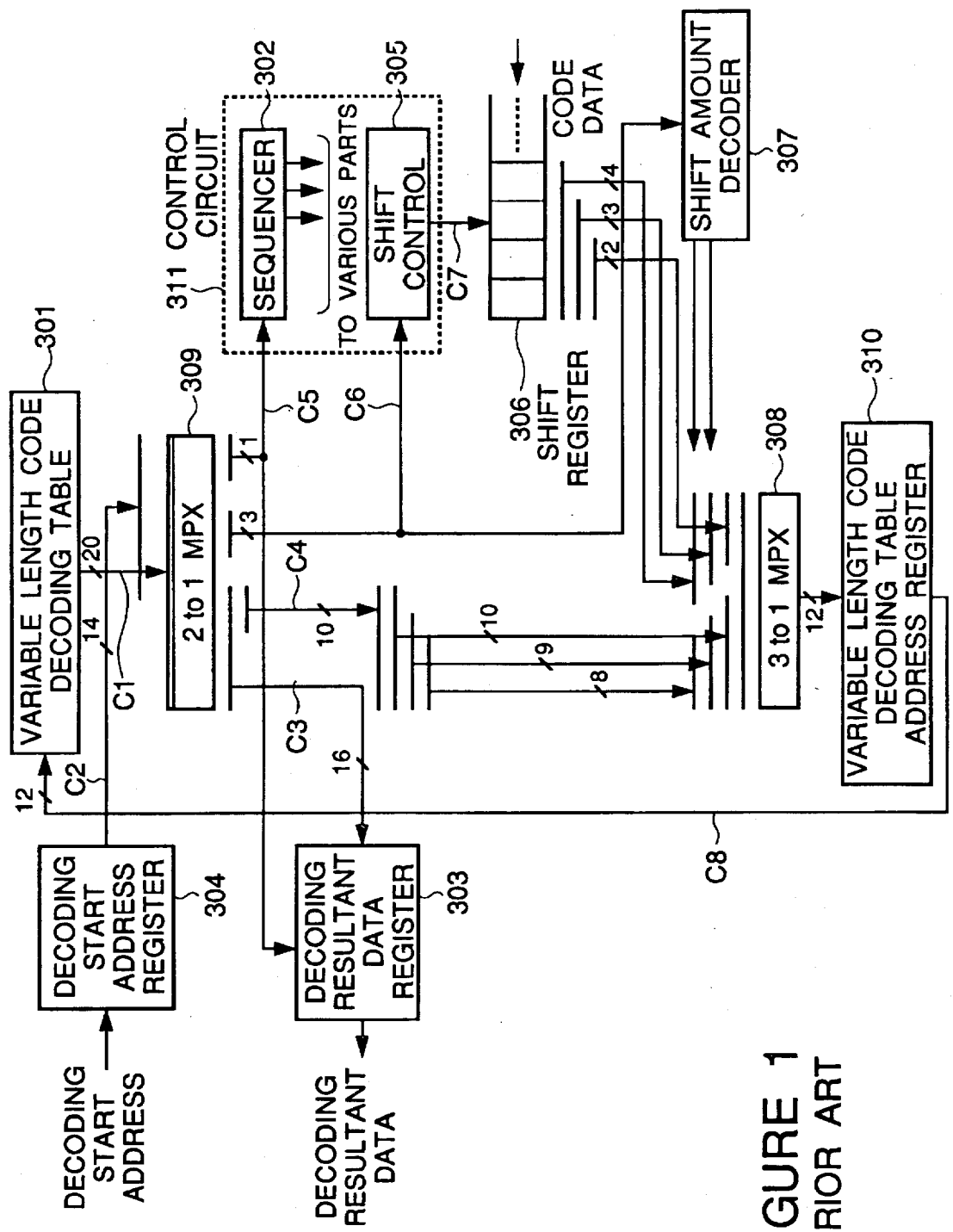
FIG. 1 is a block diagram of a conventional variable length, code decoding circuit.
Figure 2:
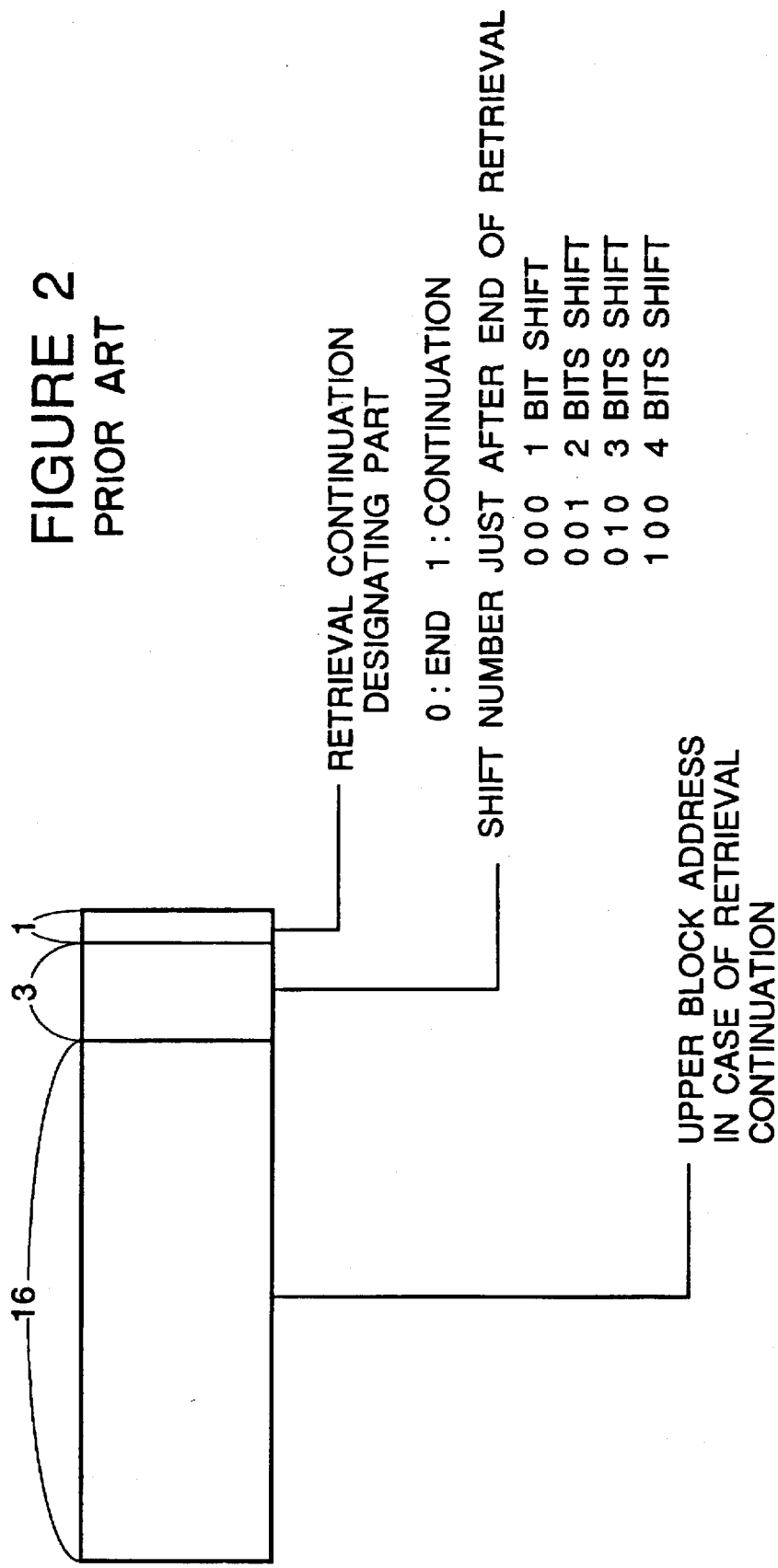
FIG. 2 illustrates the bits format of the variable length code decoding table.
Figure 4A:
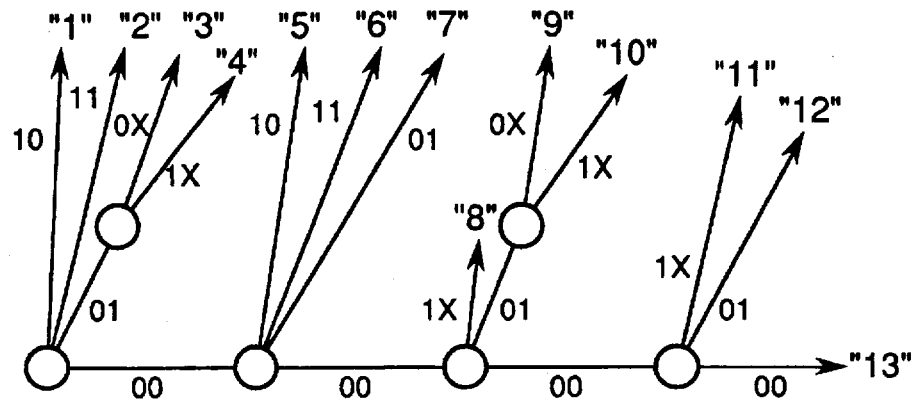
FIGS. 4A, 4B and 4C are state transition diagrams illustrating the code decoding in unit of two bits, three bits and four bits.
Figure 4B:
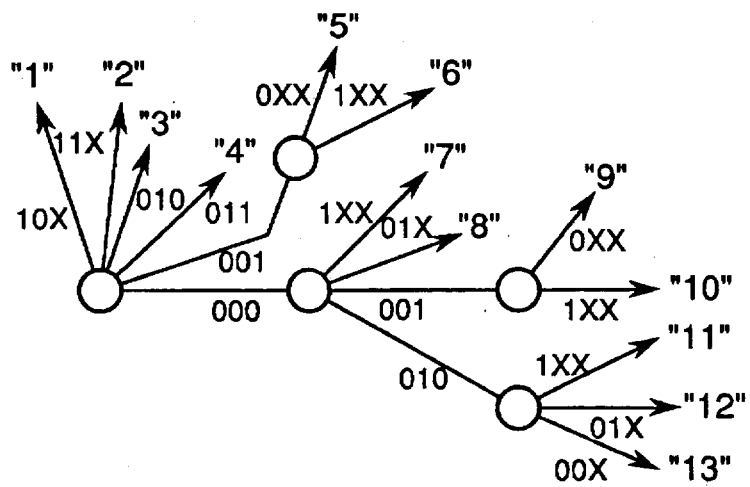
Figure 4C:
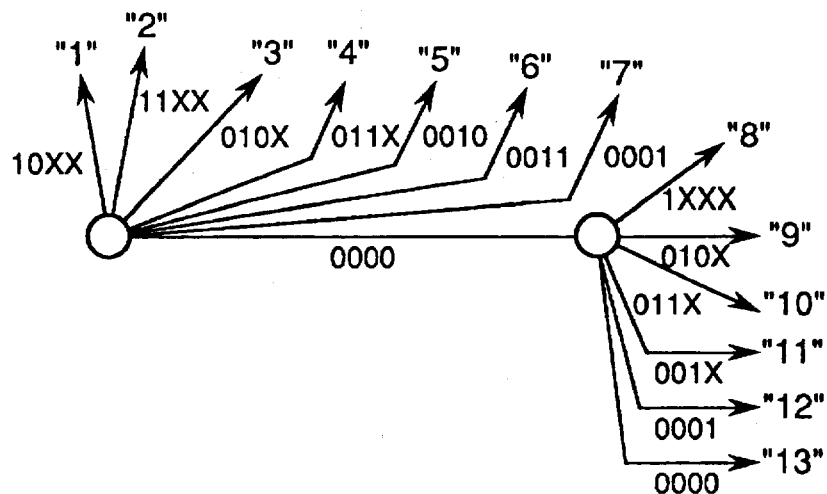
Figure 8:
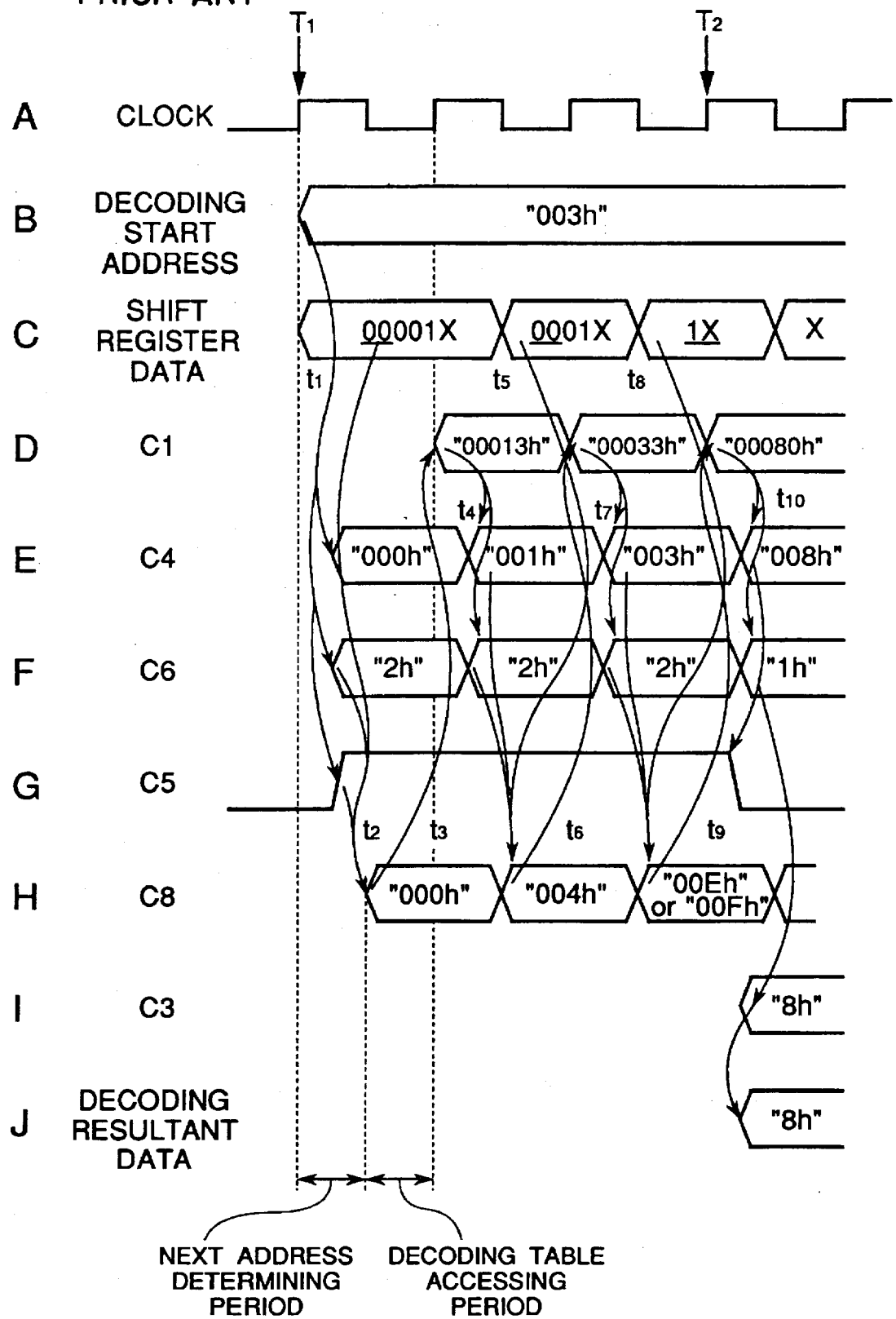
FIG. 8 is a timing chart illustrating the operation of the conventional variable length code decoding circuit shown in FIG. 1.

First, at a time T1, the decoding start address and the code data are loaded to the decoding start address register 104 and the shift register 106, respectively. At this time, of the content of the decoding start address register 104, the most significant 10 bits are the start address, and the least significant four bits indicate the shift mount to be retrieved and the retrieval continuation data. Here, assuming that the code data in the shift register 106 is "00001S", "S" is not only a sign indicating the redundancy but also the header of the next code, and therefore, "S" cannot be shifted out. Namely, the sign bit is located in the position of this "S" according to the table of FIG. 4, but in this embodiment, this "S" is processed as a simple redundant bit, not as the sign bit, similarly to the conventional variable length code decoding circuit, and thereafter, the bit "S" is separately processed after the completion of the conventional variable length code decoding processing.

At the timing t1 in FIG. 12 the decoding start address A2 is outputted without modification from the "2 to 1" multiplexor 109.as the output signals A4, A5 and A6. With the output signal A5, the start of the code retrieval is notified to the sequencer 102, and therefore, in response to this signal, the sequencer 102 generating various timing signals supplied to various parts, for controlling the start and the execution of the decoding operation.

At the timing 12 in FIG. 12, the data "00"; is shifted out of the shift register 106 in accordance with the shift amount designated by the output signal A6 (the shifting out of two bits in this example), and this data "00" is supplied as the least significant two bits to the "3 to 1" multiplexor 108. On the other hand, the 10-bit data "00 0000 0000" of the signal A4 is supplied to the "3 to 1" multiplexor 108 as the most significant 10 bits. Therefore, the "3 to 1" multiplexor 108 outputs the 12-bit data "0000 0000 0000", which is in turn supplied to and stored in the variable length code decoding table address register 110. Accordingly, for the next address, the address of "000h" is supplied from the variable length code decoding table address register 110 as the signal A8 to the variable length code decoding table 101 for data retrieval (See FIG. 5).

At the timing t3 in FIG. 12, "00013h" is outputted from the variable length code decoding table lot as the decoding table output signal A1, and supplied to the "2 to 1" multiplexor 109, which in turn outputs the signals A4, A5 and A6 at the timing t4.

At the timing t5 in FIG. 12, the data "00" is shifted out of the shift register 106 in accordance with the shift mount designated by the output signal A6 (the shifting out of two bits in this example), and this data "00" is supplied as the least significant two bits to the "3 to 1" multiplexor 108. On the other hand, the 10-bit data "00 0000 0001" of the signal A4 is supplied to the "3 to 1" multiplexor 108 as the most significant 10 bits. Therefore, the "3 to 1" multiplexor 108 outputs the 12-bit data "0000 0000 0100", which is in turn supplied to and stored in the variable length code decoding table address register 110. Accordingly, for the next address, the address of "004h" is supplied from the variable length code decoding table address register 110 as the signal A8 to the variable length code decoding table 101 for data retrieval (See FIG. 5).

At the timing t6 in FIG. 12, "00033h" is outputted from the variable length code decoding table 101 as the decoding table output signal A1. At the timing t7, the "2 to 1" multiplexor 109 outputs the signals A4, A5 and A6.

At the timing t8 in FIG. 12, the data "1S" is shifted out of the shift register 06 in accordance with the shift amount designated by the output signal A6 (the shifting out of two bits in this example), and this data "1S" is supplied as the least significant two bits to the "3 to 1" multiplexor 108, On the other hand, the 10-bit data "00 0000 0011" of the signal A4 is supplied to the "3 to 1" multiplexor 108 as the most significant 10 bits. Therefore, the "3 to 1" multiplexor 108 outputs the 12-bit data "0000 0000 111S", which is in turn supplied to and stored in the variable length code decoding table address register 110. Accordingly, for the next address, the address of "00Eh" or "00Fh" having the redundancy is supplied from the variable length code decoding table address register 110 as the signal A8 to the variable length code decoding table 101 for data retrival (See FIG. 5).

At the timing t9 in FIG. 12, "00080h" is outputted from the variable length code decoding table 101 as the decoding table output signal A1. At the timing t10, the "2 to 1" multiplexor 109 outputs the signals A4, A5 and A6.

At this time, since the output signal A5 is brought to "0", it is informed to the sequencer 102 that the decoding operation is completed. In addition, the data "0008h" is supplied as the signal A3 and stored in the decoding resultant data register 103.

At this time, the sign bit (positive/negative discriminating bit) remains at the most significant bit position of the shift register 106. This sign bit is supplied as the signal A9 to the positive/negative inversion circuit 111. Accordingly, on the basis of the sign bit of the signal A9, the data supplied from the decoding resultant data register 103 is subjected to the positive/negative inversion processing. In this case, the above mentioned data "0008h" is outputted as the decoding resultant data. Thus, the decoding operation is completed.

By repeating the above mentioned operation, the code data supplied to the shift register 106 is sequentially decoded. Similarly, the decoding operation based on the retrieval in units of three bits or in units of four bits can be performed in accordance with the tables shown in FIGS. 6 and 7.

In the above mentioned operation, it has been assumed that the most significant three bits (output signal A6) of the least significant four bits of the 20-bit output of the "2 to 1" multiplexor 109, indicate the two-bit shifting. Namely, if the output signal A6 of the "2 to 1" multiplexor 109 indicates the two-bit shift, the shift control circuit 105 receiving the output signal A6 controls the shift register 106 so as to shift out the content of the shift register 106 in units of two bits, and the shifting magnitude decoder 107 also receiving the output signal A6 controls the "3 to 1" multiplexor 108 in such a manner that the 12-bit variable length code decoding table address is constituted of the most significant two bits of the shift register 106 and the least significant ten bits (output signal A4) of the output signal A3.

However, if the output signal A6 of the "2 to 1" multiplexor 109 indicates the three-bit shift, the shift control circuit 105 controls the shift register 106 so as to shift out the content of the shift register 106 in units of three bits, and the shifting magnitude decoder 107 controls the "3 to 1" multiplexor 108 in such a manner that the 12-bit variable length code decoding table address is constituted of the most significant three bits of the shift register 106 and the most significant nine bits of the output signal A4 (ten bits).

In addition, if the output signal A6 of the "2 to 1" multiplexor 109 indicates the four-bit shift, the shift control circuit 105 controls the shift register 106 so as to shift out the content of the shift register 106 in units of four bits, and the shifting magnitude decoder 107 controls the "3 to 1" multiplexor 108 in such a manner that the 12-bit variable length code decoding table address is constituted of the most significant four bits of the shift register 106 and the most significant eight bits of the output signal A4 (ten bits).

Figure 13:
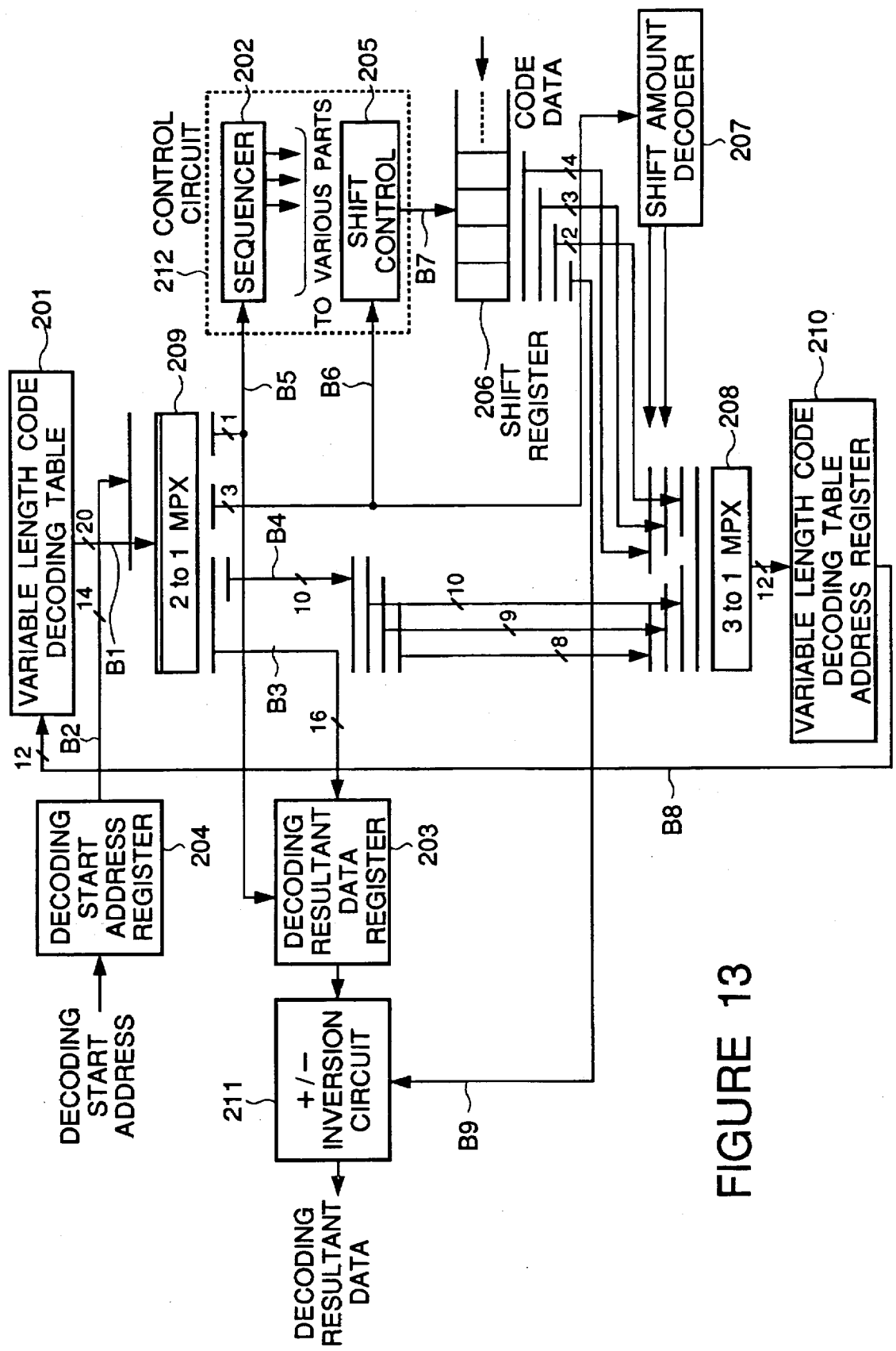
FIG. 13 is a block diagram of a second embodiment of the variable length code decoding circuit in accordance with present invention.

Referring to FIG. 13, there is shown a diagram of a second embodiment of the variable length code decoding circuit in accordance with the present invention.

The shown variable length code decoding circuit includes a 20-bit variable length code decoding table 201, a 14-bit decoding start address register 204 receiving a 14-bit decoding start address, a "2 to 1" 20-bit multiplexor 209 receiving an output signal B1 of the variable length code decoding table 201 and an output signal B2 of the decoding start address register 204, a 16-bit decoding resultant data register 203 receiving the most significant 16 bits (output signal B3) of the 20-bit output of the "2 to 1" multiplexor 209 and controlled by the least significant one bit (output signal B5) of the 20-bit output of the "2 to 1" multiplexor 209, a sequencer 202 controlled by the output signal B5, a shift control circuit 205 and a shifting magnitude decoder 207 both of which receive the most significant three bits (output signal B6) of the least significant four bits of the 20-bit output of the "2 to 1" multiplexor 209, a shift register 206 receiving the code data and controlled by an output signal B7 of the shift control circuit 205 to shift the received code data, a "3 to 1" 12-bit multiplexor 208 receiving the shifted data output signal of the shift register 206 and the least significant ten bits (output signal B4) of the output signal B3, a 12-bit variable length code decoding table address register 210 receiving an output of the "3 to 1" multiplexor 208, for generating an output signal B8 to be supplied to the variable length code decoding table 201, and a positive/negative inversion circuit 211 receiving an output of the decoding resultant data register 203 and controlled so as to output either the received data without modification or an inverted data of the received data. A control circuit 212 is constituted of the sequencer 202 and the shift control circuit 205.

The second embodiment is different from the first embodiment only in that, in the first embodiment, the most significant bit of the shift register 206 is supplied directly to the positive/negative inversion circuit 211, but in the second embodiment, after the decoding operation is completed, the sequencer 202 discriminates the end signal, and the shift register 206 is further shifted one bit so that the most significant bit of the content of the shift register is used as the positive/negative discriminating data to the positive/ negative inversion circuit 211 in the form of a signal B9.

The operation other than this difference is completely the same as that of the first embodiment, and therefore, explanation of the operation will be omitted. Therefore, by repeating the operation similar to that of the first embodiment, the code data supplied to the shift register 206 is sequentially decoded. Similarly, the decoding operation based on the retrieval in units of three bits or in units of four bits can be performed in accordance with the tables shown in FIGS. 6 and 7.

As seen from the above, the variable length code decoding circuit in accordance with the present invention is characterized by providing the positive/negative inversion circuit which directly receives the most significant bit of the shift register receiving the code data. Therefore, for the variable length code data accompanying the sign bit, the positive/ negative discriminating processing can be performed independently of the decoding processing. Thus, although the size of the viable length code decoding table becomes large and the data length of the codes increased one bit, it is possible to avoid the drop of the decoding processing, which would occur because of the increase in the number of the decoding processing cycles.

In addition, the data recorded in the variable length code decoding table used in the prior art can be used without modification. Accordingly, the variable length code decoding circuit in accordance with the present invention can be used for a color moving image compress technology in accordance with the MPEGI of the 1SO standard. Furthermore, it is possible to handle an image larger than the MPEGI of the 1SO standard.

The invention has thus been shown and described with reference to the specific embodiments. However, it should be noted that the present invention is in no way limited to the details of the illustrated structures but changes and modifications may be made within the scope of the appended claims.

I claim:

1. A variable length code decoding circuit comprising:

a variable length code decoding table;

a first memory means receiving and storing a decoding start address;

a first selecting means receiving an output signal of said variable length code decoding table 101 and an output signal of said first memory means so as to output one selected output signal;

a shift register receiving and storing a sequence of variable length codes to be decoded;

a control means receiving the least significant "n" bits of said one selected output signal (where "n" is any positive integer), for controlling a bit shift amount of said shift register;

a second selecting means receiving a portion of the code data stored in said shift register and the least significant "k" bits of the most significant "m" bits of said one selected output signal (where "k" and "m" are any positive integer and "k" is not greater than "m"), for outputting a synthesized address signal;

a second memory means receiving and storing said synthesized address signal, for supplying the stored synthesized address signal to said variable length code decoding table;

a third memory means receiving and storing said most significant "m" bits; and positive/negative inversion circuit receiving a content of said third memory means and controlled by a control signal generated on the basis of the content of said shift register so as to output either the received content of said third memory means without modification or an inverted data of the received content of said third memory means.

2. A variable length code decoding circuit claimed in claim 1 wherein said positive/negative inversion circuit directly receives the most significant bit of the code data stored in said shift register, for discriminating a positive/ negative of a decoding resultant data signal, and for outputting, as the decoding resultant data signal, either the received content of said third memory means without modification or an inverted data of the received content of said third memory means.

3. A variable length code decoding circuit claimed in claim 2 wherein said control means includes a sequencer receiving the least significant bit of said least significant "n" bits of said one selected output signal, for controlling an operating timing of the decoding operation, and a shift control circuit receiving some most significant bits of said least significant "n" bits of said one selected output signal, for controlling a bit shift operation of said shift register.

4. A variable length code decoding circuit claimed in claim 1 wherein said positive/negative inversion circuit directly receives, as a positive/negative discriminating bit, the most significant bit of said shift register after shifting the contents of said shift register, for discriminating a positive/ negative of a decoding resultant data signal, and for outputting, as the decoding resultant data signal, either the received content of said third memory means without modification or an inverted data of the received content of said third memory means.

5. A variable length code decoding circuit claimed in claim 4 wherein said control means includes a sequencer receiving the least significant bit of said least significant "n" bits of said one selected output signal, for controlling an operating timing of the decoding operation, and a shift control circuit receiving some most significant bits of said least significant "n" bits of said one selected output signal, for controlling a bit shift operation of said shift register.

6. A variable length code decoding circuit including a variable length code decoding table, a decoding start address register, a first multiplexor receiving an output of the variable length code decoding table and an output of the decoding start address register, a decoding resultant data register receiving the most significant bits of an output of the first multiplexor and controlled by the least significant bit of the output of the first multiplexor, a shift control circuit receiving some intermediate significant bits of the output of the first multiplexor, a shift register receiving a code data and controlled by the shift control circuit to shift the received code data, a second multiplexor receiving the shifted data output signal of the shift register and some intermediate significant bits of the output of the first multiplexor, a variable length code decoding table address register receiving an output of the second multiplexor, for generating a next accessing address to the variable length code decoding table, and a positive/negative inversion circuit receiving an output of the decoding resultant data register and controlled by a control signal generated on the basis of the content of the shift register so as to output either the received data without modification or an inverted data of the received data.

* * * * *